United States Patent
Hong et al.

(10) Patent No.: US 11,428,739 B1
(45) Date of Patent: Aug. 30, 2022

(54) DEVICE AND METHOD FOR RAPIDLY DETECTING ENERGY EFFICIENCY OF PERMANENT MAGNET SYNCHRONOUS MOTOR

(71) Applicants: Jinling Haiguan Technical Center, Nanjing (CN); Jiangsu Yangtze Testing and Certification Co., Ltd., Nanjing (CN)

(72) Inventors: Ying Hong, Nanjing (CN); Wei An, Nanjing (CN); Jiadan Wei, Nanjing (CN); Yangyun Wu, Nanjing (CN); Junwei Xu, Nanjing (CN); Ling Gao, Nanjing (CN); Ke Chen, Nanjing (CN); Jinling Wang, Nanjing (CN); Chen Tang, Nanjing (CN); Jiansong Chen, Nanjing (CN)

(73) Assignee: JINLING HAIGUAN TECHNICAL CENTER, Nanjing (CN)

( * ) Notice: Subject to any disclaimer, the term of this patent is extended or adjusted under 35 U.S.C. 154(b) by 0 days.

(21) Appl. No.: 17/550,187

(22) Filed: Dec. 14, 2021

(30) Foreign Application Priority Data

Feb. 9, 2021 (CN) .......................... 202110174067.7

(51) Int. Cl.
*G01R 31/34* (2020.01)
(52) U.S. Cl.
CPC ................................. *G01R 31/343* (2013.01)
(58) Field of Classification Search
CPC .............................. G01R 31/343; G01R 31/34
See application file for complete search history.

(56) References Cited

FOREIGN PATENT DOCUMENTS

| CN | 202102089 U | 1/2012 |
|----|-------------|--------|
| CN | 103267949 A | 8/2013 |
| CN | 104965174 A | 10/2015 |
| CN | 206378163 U | 8/2017 |

(Continued)

OTHER PUBLICATIONS

He et al., Analysis and Design of Surface Permanent Magnet Synchronous Motor and Generator, Mar. 2019, CES Transactions on Electrical Machines and Systems, vol. 3, No. 1, pp. 94-100 (Year: 2019).*

(Continued)

*Primary Examiner* — Toan M Le
(74) *Attorney, Agent, or Firm* — McClure, Qualey & Rodack, LLP

(57) ABSTRACT

A device for rapidly detecting energy efficiency of a permanent magnet synchronous motor includes a test platform, an energy circulation device, and a data synchronous acquisition module, the test platform being fixedly connected to support legs via threads, an upper end surface of the test platform being provided with baffles to define a motor mounting tank, a bolt hole being provided in a surface of an outer baffle of the motor mounting tank, the energy circulation device being mounted on a fixed baffle on one end of the motor mounting tank, a second intelligent power analyzer, a first intelligent power analyzer, and a temperature inspection instrument being sequentially mounted on an upper surface of a tail end on a right side of the test platform, and the data synchronous acquisition module being provided on one end of an inner wall of the motor mounting tank.

6 Claims, 2 Drawing Sheets

(56) References Cited

FOREIGN PATENT DOCUMENTS

| | | |
|---|---|---|
| CN | 109507588 A | 3/2019 |
| CN | 111537882 A | 8/2020 |
| CN | 112202382 A | 1/2021 |
| CN | 212379531 U | 1/2021 |
| KR | 20190054700 A | 5/2019 |

OTHER PUBLICATIONS

Hong et al., Multi-Objective Optimal Design of Permanent Magnet Synchronous Motor for High Efficiency and High Dynamic Performance, May 16, 2018, IEEE Access: Special Section on Advanced Energy Storage Technologies and Their Applications, vol. 6, pp. 23569-23581 (Year: 2018).*
Chinese language Search Report dated Feb. 9, 2021 in Chinese application No. 2021101740677.
English language Search Report dated Feb. 9, 2021 in Chinese application No. 2021101740677.
CN Office Action dated Mar. 29, 2021 in Chinese application No. 2021101740677.
English translation of CN Office Action dated Mar. 29, 2021 in Chinese application No. 2021101740677.
CN Office Action dated Apr. 21, 2021 in Chinese application No. 2021101740677.
English translation of CN Office Action dated Apr. 21, 2021 in Chinese application No. 2021101740677.
CN Notice of Allowance dated Jul. 2, 2021 in Chinese application No. 202110174067.7.
English translation of CN Notice of Allowance dated Jul. 2, 2021 in Chinese application No. 202110174067.7.

* cited by examiner

DEVICE AND METHOD FOR RAPIDLY DETECTING ENERGY EFFICIENCY OF PERMANENT MAGNET SYNCHRONOUS MOTOR

TECHNICAL FIELD

The present invention relates to a device and method for rapidly detecting energy efficiency of a permanent magnet synchronous motor, and belongs to the technical field of detection devices and detection methods.

BACKGROUND ART

As economic development in human society is making greater demand on energy and non-renewable resources such as oil and coal are running out, the energy shortage has become a global issue. China also makes a contribution to the promotion of the variable-frequency permanent magnet motor technology, which is widely used in various industries and is of great significance to alleviate the energy shortage. In China, the industrial energy consumption accounts for about 70% of the total energy consumption in China, of which about 60%-70% is the motor energy consumption and the rest is the non-industrial motor energy consumption, so the actual motor energy consumption accounts for more than 50% of the total energy consumption. In China, motors are widely used and consume massive electric energy, of which a small minority are energy-efficient motors and a majority are aged ones, resulting in low efficiency.

The research on permanent magnet motors starts late but develops rapidly owing to the great effort of the domestic scholars and the government. Especially in the field of new energy vehicles, the permanent magnet synchronous motor is widely used. As seen from the production and sales data released by China Association of Automobile Manufacturers, the production amount and the sales amount of new energy vehicles in 2017 are 794000 and 777000 respectively, with year-on-year increases of 53.8% and 53.3% respectively, ranking first in the world for three consecutive years. The rapid development of the new energy vehicles makes it possible to rapidly develop the permanent magnet synchronous motor, and the development of the permanent magnet synchronous motor technology has become a focus of concern in the industry. Yet the permanent magnet synchronous motor has the low detection efficiency and the incapacity to test the motor loss and save more energy.

SUMMARY OF INVENTION

Aiming at the defects in the prior art, the present invention provides a device and method for rapidly detecting energy efficiency of a permanent magnet synchronous motor, so as to solve low detection efficiency and incapacity to save more energy of the motor.

In order to solve the technical problems, the present invention uses the following technical solution:

The present invention discloses a device and method for rapidly detecting energy efficiency of a permanent magnet synchronous motor. The device includes a test platform, an energy circulation device, and a data synchronous acquisition module, four corners of a lower end surface of the test platform being fixedly connected to support legs, the support leg being in threaded connection to the test platform through a support rod, an upper end surface of the test platform being provided with baffles to define a motor mounting tank, a bolt hole being provided in a surface of an outer baffle of the motor mounting tank in a penetrating mode, the energy circulation device being mounted on a surface of a fixed baffle on one end of the motor mounting tank, a second intelligent power analyzer, a first intelligent power analyzer, and a temperature inspection instrument being sequentially mounted on an upper surface of a tail end on a right side of the test platform, the second intelligent power analyzer, the first intelligent power analyzer, and the temperature inspection instrument being electrically connected to the energy circulation device through wires, and the data synchronous acquisition module being provided on one end of an inner wall of the motor mounting tank in an abutting mode.

Further, the motor mounting tank is in threaded connection to a guide rod through a through hole penetrating the surface of the baffle, an outer surface of the guide rod being fixedly connected to a spring, and a front surface of the guide rod being fixedly provided with a limiting flange.

Further, the energy circulation device includes an incoming line control apparatus, variable-frequency power supplies, a test system apparatus, and a peripheral auxiliary apparatus, the incoming line control apparatus including an incoming line unit and a rectification unit, the incoming line unit being positioned on an upper side of the rectification unit and connected to a controller, the variable-frequency power supplies being variable-frequency board mounted power 1 (BMP1) and board mounted power 2 (BMP2), four variable-frequency power supplies being provided, the four variable-frequency power supplies all being positioned on a lower side of the rectification unit, the test system apparatus including an intelligent measurement unit, a motor to be tested, and an accompanying motor to be tested, one end of the intelligent measurement unit being electrically connected to one end of a motor through a wire, the other end of the motor being connected to the variable-frequency power supply, the peripheral auxiliary apparatus being a programmable logic controller (PLC), and the incoming line control apparatus, the variable-frequency power supply, the test system apparatus, and the peripheral auxiliary apparatus being electrically connected to the PLC through wires.

Further, the data synchronous acquisition module includes a control module, a data acquisition module, and a data analysis module, a principle of the data acquisition module being that acquired data in the motor are automatically input into an external detection and analysis system through a sensor, and an output line is connected between the motor and a detection apparatus, and a principle of the data analysis module being that the data analysis module is connected to the data acquisition module through a transmission line, then motor operation data acquired by the data acquisition module are transmitted to the data analysis module through the transmission line, and when the acquired data of the data acquisition module are transmitted, the data analysis module will receive a starting signal and feed the signal back to a data analyzer for data analysis, to realize feedback finally.

A data acquisition process of the data acquisition module includes:

step 1: creating, according to operation parameters set through a microprocessor in the control module, wireless connection between the data acquisition module and an external master station server;

step 2, synchronously acquiring, by the microprocessor in the control module through a data acquisition interface circuit according to a set task, motor parameters at the same time point, and then transmitting acquired data to a memory; and step 3, reading, by the master station server through a wireless communication module, data parameters in the memory regularly.

A data analysis process of the data analysis module includes:

step 1, obtaining the data transmitted by the data acquisition module to the memory to be stored, then taking, according to different states, motor parameters including a rotation speed, a position, torque, a voltage, a current, a temperature, and vibration as a data analysis matrix, the data analysis matrix including a current accuracy parameter vector and a current efficiency parameter vector, the accuracy parameter vector being obtained from motor operation data, and the motor operation data including a voltage, a current, a rotation angle, and a rotation speed, determining, through an iteration coefficient of the data parameter, an initial vector, and a convergence method, whether the parameter is an accuracy parameter, so as to screen the accuracy parameter from all parameters, the efficiency parameter vector also being obtained from motor operation data, the motor operation data including a voltage, a current, a rotation angle, and a rotation speed, and determining, through an iteration coefficient of the data parameter, an initial vector, and a convergence method, whether the parameter, an efficiency value, is within a normal value range of the motor parameter, so as to screen an efficiency parameter from all parameters;

step 2, determining, according to a current accuracy parameter vector and a current efficiency parameter vector of each data analysis matrix, an optimal data analysis matrix; and step 3, outputting the optimal data analysis matrix.

Further, in step 2 of the data acquisition process of the data acquisition module, motor parameters are acquired in four states: a cold state, a thermally stable state, a load state, and a no-load state, and then motor parameters in different states are obtained.

Further, in step 2 of the data analysis process of the data analysis module, an initial iteration parameter k is set as 0, the number of current iteration k is added by 1, the current accuracy parameter vector and the current efficiency parameter vector are substituted into a determination parameter formula:

$$Z^k = \omega * \sum_{i=1}^{m}\sum_{j=1}^{n} A_{ij}^K + \varsigma * \sum_{i=1}^{m}\sum_{j=1}^{n} E_{ij}^K$$

$$A_{ij}^K$$

and $$E_{ij}^K$$

denoting the current accuracy parameter vector and the current efficiency parameter vector respectively, $Z^k$ denoting a current determination parameter of the data analysis matrix, k denoting the number of current iteration, k∈[1,d], d being a preset threshold value, m and n denoting adjustment constants, i denoting the number of rows of the data analysis matrix, i=0, 1, m, j denoting the number of columns of the data analysis matrix, and j=0, 1, n, and according to the determination parameter formula described above, a current determination parameter of each data analysis matrix is calculated.

Further, an evaluation value and an evaluation reference value of a data analysis matrix currently with the maximum determination parameter are generated according to an accuracy parameter vector and an efficiency parameter vector of the data analysis matrix currently with the maximum determination parameter. Then according to an evaluation value function:

$$\theta^k = \omega * \int_0^\omega \frac{1}{\sqrt{\left|\sum_{i=1}^{m}\sum_{j=1}^{n} A_{ij}^K\right|^3}} dx + \varsigma * \int_0^\omega \frac{1}{\sqrt{\left|\sum_{i=1}^{m}\sum_{j=1}^{n} E_{ij}^K\right|^3}} dx$$

θk denoting the evaluation value of the data analysis matrix currently with the maximum determination parameter, and ω and ζ denoting adjustment factors of the accuracy parameter vector and the efficiency parameter vector respectively, the accuracy parameter vector and the efficiency parameter vector of the data analysis matrix currently with the maximum determination parameter are substituted into an iteration evaluation value function, to obtain an evaluation value of the data analysis matrix currently with the maximum determination parameter. Finally according to an iteration evaluation reference value function:

$$(R^k)^2 = (m*n) * \sum_{i=1}^{m}\sum_{j=1}^{n}\left(M_{ij}^K - \overline{M^{GK}}\right)^2$$

$M_{ij}^K$ denoting a complex vector of the data analysis matrix currently with the maximum determination parameter, $$\overline{M^{GK}}$$

denoting an average value of the complex vector of the data analysis matrix currently with the maximum determination parameter, and $(R^k)^2$ denoting the evaluation reference value of the data analysis matrix currently with the maximum determination parameter, the complex vector and the average value of the data analysis matrix with the maximum determination parameter generated through the accuracy parameter vector and the efficiency parameter vector are substituted into the iteration evaluation reference value function, to finally obtain an evaluation reference value of the data analysis matrix with the maximum determination parameter.

Further, the current accuracy parameter vector and the current efficiency parameter vector of each data analysis matrix are substituted into a formula:

$$B_{ij}^{k+1} = \left\{\frac{1}{\sqrt[3]{D(|A_{ij}^K - A^{GK}|^3)}}, \frac{1}{\sqrt[3]{D(|E_{ij}^K - E^{GK}|^3)}}\right\}$$

$B_{ij}^{k+1}$ denoting a calculated state transition parameter vector of the data analysis matrix at the k+1th iteration, $A^{GK}$ denoting a global accuracy parameter vector of all current data analysis matrices, and $E^{GK}$ denoting efficiency parameter vectors of all the current data analysis matrices, a state transition parameter vector of each data analysis matrix is calculated at the k+1th iteration, finally a data analysis matrix currently with the maximum determination parameter is output, and motor loss may be obtained based on use of a motor efficiency formula for an output data analysis matrix, so as to rapidly detect the motor parameter.

Compared with the prior art, the present invention has the beneficial effects:

Through a power supply system with a modular structure in the energy circulation device and operation software control, energy circulation between inside and outside is realized, electric consumption of a power grid is reduced. A data acquisition modular structure is used, for synchronously acquiring measured parameters, thereby effectively improving system detection accuracy.

Compared with an existing variable-frequency permanent magnet synchronous motor, the present invention innovatively includes: obtaining the motor parameter through the data acquisition process of the data acquisition module, determining, according to the accuracy parameter vector and the current efficiency parameter vector in the data analysis module, the optimal data analysis matrix, performing, mainly through the initial iteration parameter, calculation by the iteration number, obtaining, according to the iteration evaluation reference value function, the evaluation value and the evaluation reference value, substituting the evaluation value and the evaluation reference value into the iteration evaluation condition to obtain the data analysis matrix, and obtaining, based on the use of the motor efficiency formula for the output data analysis matrix, the motor loss, so as to rapidly detect the motor parameter, thereby obtaining the motor loss; and the data acquisition modular structure is used, for synchronously acquiring the measured parameter, thereby effectively improving the system detection accuracy.

In the figures: 1. test platform; 2. support leg; 3. temperature inspection instrument; 4. first intelligent power analyzer; 5. second intelligent power analyzer; 6. energy circulation device; 7. bolt hole; 8. motor mounting tank; 9. limiting flange; 10. spring; 11. guide rod; 12. motor; 13. intelligent measurement unit; 14. variable-frequency power supply; 15. rectification unit; 16. incoming line unit; 17. torque and rotation speed sensor; 18. data synchronous acquisition module; 19. control module; 20. data acquisition module; and 21. data analysis module.

DETAILED DESCRIPTION OF EMBODIMENTS

In order to make the objective, the technical solution, and the advantages of the present invention more clear, the present invention is further described in detail with reference to the accompanying drawings and the embodiments. It should be understood that the specific embodiments described herein are merely illustrative of the present invention and are not intended to limit the present invention.

Figure 1:
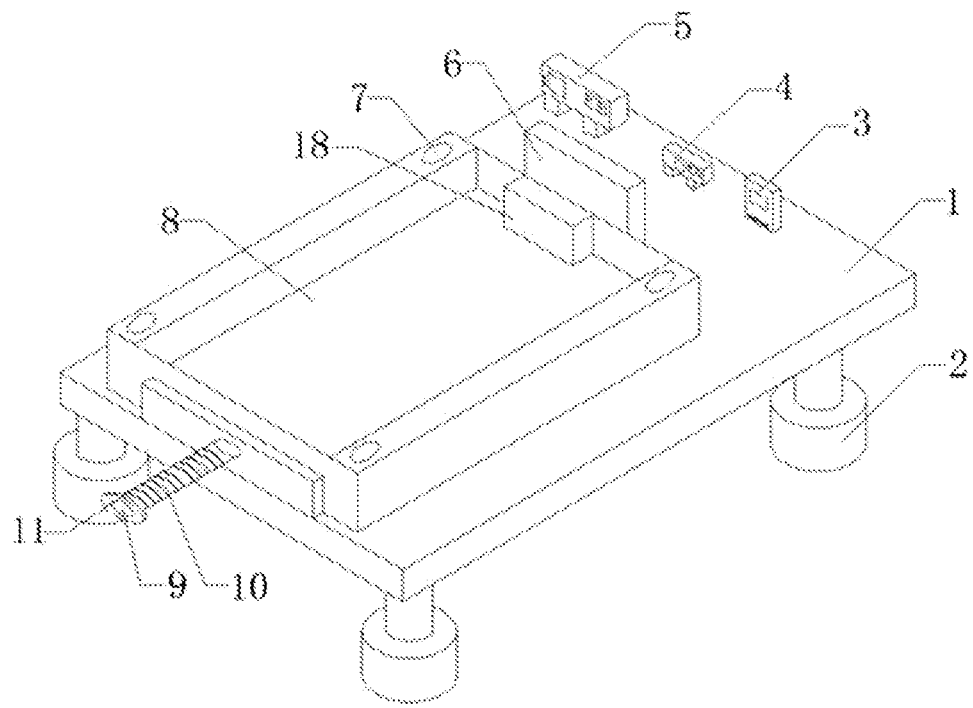
FIG. 1 is an overall structural schematic diagram of the present invention.

As shown in FIG. 1, the present invention discloses a device and method for rapidly detecting energy efficiency of a permanent magnet synchronous motor. The device includes a test platform 1, an energy circulation device 6, and a data synchronous acquisition module 18, four corners of a lower end surface of the test platform 1 being fixedly connected to support legs 2, the support leg 2 being in threaded connection to the test platform 1 through a support rod, an upper end surface of the test platform 1 being provided with baffles to define a motor mounting tank 8, a bolt hole 7 being provided in a surface of an outer baffle of the motor mounting tank 8 in a penetrating mode, the energy circulation device 6 being mounted on a surface of a fixed baffle on one end of the motor mounting tank 8, a second intelligent power analyzer 5, a first intelligent power analyzer 4, and a temperature inspection instrument 3 being sequentially mounted on an upper surface of a tail end on a right side of the test platform 1, the second intelligent power analyzer 5, the first intelligent power analyzer 4, and the temperature inspection instrument 3 being electrically connected to the energy circulation device 6 through wires, and the data synchronous acquisition module 18 being provided on one end of an inner wall of the motor mounting tank 8 in an abutting mode. Firstly, an operator fixes a motor 12 in the motor mounting tank 8, the external support leg 2 and a guide rod 11 may fix the motor 12 in a detection process, and a spring 10 and a limiting flange 9 may further stabilize and protect the motor 12. Then through a power supply system with a modular structure in the energy circulation device 6 and operation software control, energy circulation between inside and outside is realized. The second intelligent power analyzer 5 and the first intelligent power analyzer 4 analyze a current and a voltage of the motor 12 and a torque and rotation speed signal of a torque and rotation speed sensor 17, and the temperature inspection instrument 3 may analyze different temperatures, thereby improving detection efficiency and accuracy of analyzing a motor parameter.

Figure 2:
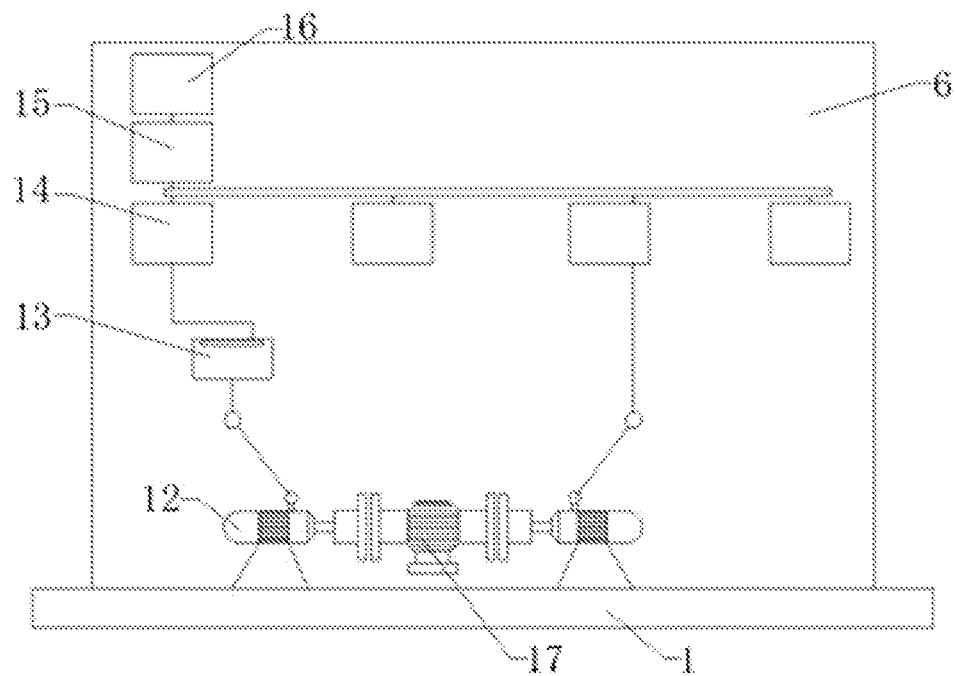
FIG. 2 is a structural schematic diagram of internal circulation of an energy circulation device of the present invention.
Figure 3:
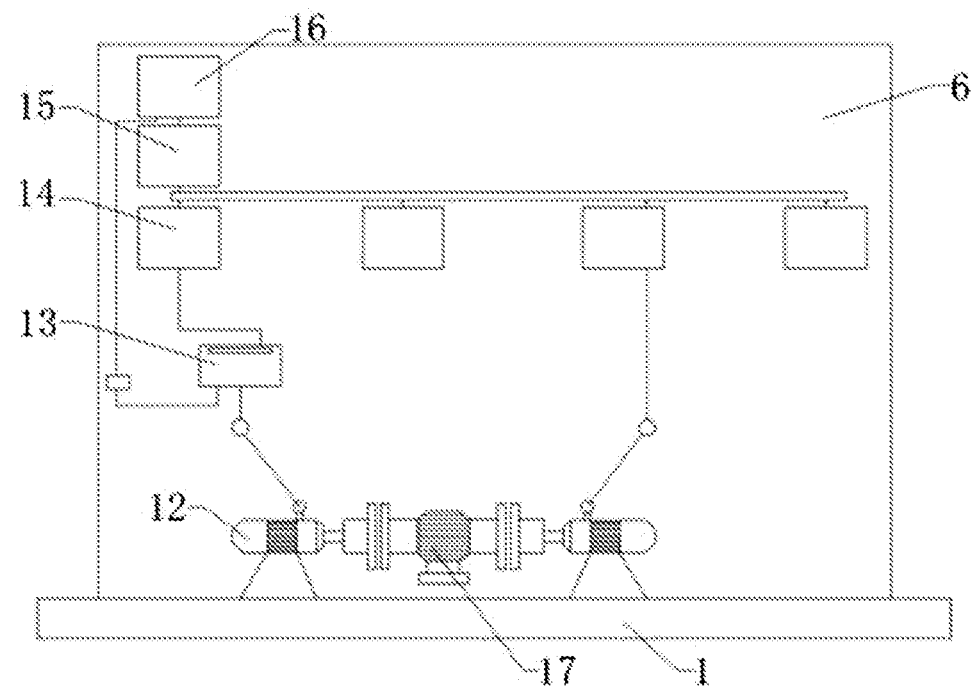
FIG. 3 is a structural schematic diagram of external circulation of the energy circulation device of the present invention.
Figure 4:
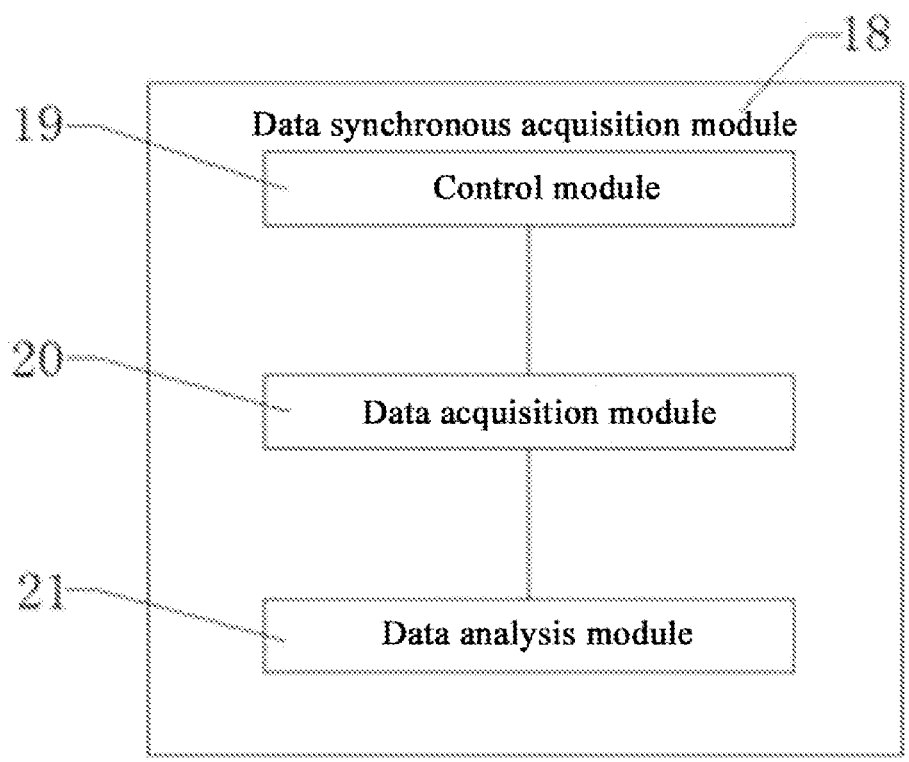
FIG. 4 is a flow chart of a data synchronous acquisition module of the present invention.

As shown in FIGS. 2-3, the energy circulation device 6 includes an incoming line control apparatus, variable-frequency power supply 14, a test system apparatus, and a peripheral auxiliary apparatus, the incoming line control apparatus including an incoming line unit 16 and a rectification unit 15, the incoming line unit 16 being positioned on an upper side of the rectification unit 15 and connected to a controller, the variable-frequency power supplies 14 being variable-frequency board mounted power 1 (BMP1) and board mounted power 2 (BMP2), four variable-frequency power supplies 14 being provided, the four variable-frequency power supplies 14 all being positioned on a lower side of the rectification unit 15, the test system apparatus including an intelligent measurement unit 13, a motor to be tested, and an accompanying motor to be tested, one end of the intelligent measurement unit 13 being electrically connected to one end of the motor 12 through a wire, the other end of the motor 12 being connected to the variable-frequency power supply 14, the peripheral auxiliary apparatus being a programmable logic controller (PLC), and the incoming line control apparatus, the variable-frequency power supply 14, the test system apparatus, and the peripheral auxiliary apparatus being electrically connected to the PLC through wires. When an asynchronous starting winding is driven and variable-frequency starting is performed, a common direct current bus mode is used, and the motor to be tested and the accompanying motor to be tested perform energy circulation. As shown in FIG. 2, firstly, the incoming line unit 16 transmits electric energy to the rectification unit 15, then the variable-frequency BMP1 of the variable-frequency power supplies 14 transmits the electric energy to the intelligent measurement unit 13 to test the energy, and finally the electric energy is supplied to the motor to be tested. Then the electric energy is transmitted to the variable-frequency BMP1 and BMP2 of the variable-frequency power supplies 14 through the accompanying motor to be tested, for internal circulation. As shown in FIG. 3, under the action of an external permanent magnet synchronous motor controller, the electric energy in the incoming line unit 16 is directly transmitted to the intelligent measurement unit 13 through the permanent magnet synchronous motor controller, and finally transmitted to the motor to be tested for use, and then the accompanying motor to be tested transmits the electric energy to the rectification unit 15 through the variable-frequency power supply 14, and finally into the incoming line unit 16, for external energy circulation.

As shown in FIG. 3, the data synchronous acquisition module 18 includes a control module 19, a data acquisition module 20, and a data analysis module 21, a principle of the data acquisition module 20 being that acquired data in the motor are automatically input into an external detection and analysis system through a sensor, and an output line is connected between the motor and a detection apparatus, and a principle of the data analysis module 21 being that the data analysis module is connected to the data acquisition module 20 through a transmission line, then motor operation data acquired by the data acquisition module 20 are transmitted to the data analysis module 21 through the transmission line, and when the acquired data of the data acquisition module 20 are transmitted, the data analysis module 21 will receive a starting signal and feed the signal back to a data analyzer for data analysis, to realize feedback finally.

A data acquisition process of the data acquisition module 20 includes:

step 1, create, according to operation parameters set through a microprocessor in the control module 19, wireless connection between the data acquisition module 20 and an external master station server;

step 2, synchronously acquire, by the microprocessor in the control module 19 through a data acquisition interface circuit according to a set task, motor parameters at the same time point, and then transmit acquired data to a memory; and step 3, read, by the master station server through a wireless communication module, data parameters in the memory regularly or randomly.

In step 2 of the data acquisition process of the data acquisition module 20, motor parameters are acquired in four states: a cold state, a thermally stable state, a load state, and a no-load state, and then motor parameters in different states are obtained.

A data analysis process of the data analysis module 21 includes:

step 1, obtain the data transmitted by the data acquisition module 20 to the memory to be stored, and then take parameters including a rotation speed, a position, torque, a voltage, a current, a temperature, and vibration as a data analysis matrix, the data analysis matrix including a current accuracy parameter vector and a current efficiency parameter vector;

step 2, determine, according to a current accuracy parameter vector and a current efficiency parameter vector of each data analysis matrix, an optimal data analysis matrix; and step 3, output the optimal data analysis matrix.

In step 2, an initial iteration parameter k is set as 0, the number of current iteration k is added by 1, the current accuracy parameter vector and the current efficiency parameter vector are substituted into a determination parameter formula:

$$Z^k = \omega * \sum_{i=1}^{m} \sum_{j=1}^{n} A_{ij}^K + \varsigma * \sum_{i=1}^{m} \sum_{j=1}^{n} E_{ij}^K$$

$A_{ij}^K$ and $E_{ij}^K$ denoting the current accuracy parameter vector and the current efficiency parameter vector respectively, $Z^k$ denoting a current determination parameter of the data analysis matrix, k denoting the number of current iteration, $k \in [1,d]$, d being a preset threshold value, m and n denoting adjustment constants, i denoting the number of rows of the data analysis matrix, i=0, 1, m, j denoting the number of columns of the data analysis matrix, and j=0, 1, n, and according to the determination parameter formula described above, a current determination parameter of each data analysis matrix is calculated.

Further, an evaluation value and an evaluation reference value of a data analysis matrix currently with the maximum determination parameter are generated according to an accuracy parameter vector and an efficiency parameter vector of the data analysis matrix currently with the maximum determination parameter. Then according to an evaluation value function:

$$\theta^k = \omega * \int_0^\omega \frac{1}{\sqrt{\left|\sum_{i=1}^{m} \sum_{j=1}^{n} A_{ij}^K\right|^3}} dx + \varsigma * \int_0^\omega \frac{1}{\sqrt{\left|\sum_{i=1}^{m} \sum_{j=1}^{n} E_{ij}^K\right|^3}} dx$$

θk denoting the evaluation value of the data analysis matrix currently with the maximum determination parameter, and ω and ζ denoting adjustment factors of the accuracy parameter vector and the efficiency parameter vector respectively, the accuracy parameter vector and the efficiency parameter vector of the data analysis matrix currently with the maximum determination parameter are substituted into an iteration evaluation value function, to obtain an evaluation value of the data analysis matrix currently with the maximum determination parameter. Finally according to an iteration evaluation reference value function:

$$(R^k)^2 = (m*n) * \sum_{i=1}^{m} \sum_{j=1}^{n} \left(M_{ij}^K - \overline{M^{GK}}\right)^2$$

$M_{ij}^K$ denoting a complex vector of the data analysis matrix currently with the maximum determination parameter, $$\overline{M^{GK}}$$

denoting an average value of the complex vector of the data analysis matrix currently with the maximum determination parameter, and $(R^k)^2$ denoting the evaluation reference value of the data analysis matrix currently with the maximum determination parameter, the complex vector and the average value of the data analysis matrix with the maximum determination parameter generated through the accuracy parameter vector and the efficiency parameter vector are substituted into the iteration evaluation reference value function, to finally obtain an evaluation reference value of the data analysis matrix with the maximum determination parameter Further, the current accuracy parameter vector and the current efficiency parameter vector of each data analysis matrix are substituted into a formula:

$$B_{ij}^{k+1} = \left\{ \frac{1}{\sqrt[3]{D(|A_{ij}^K - A^{GK}|^3)}}, \frac{1}{\sqrt[3]{D(|E_{ij}^K - E^{GK}|^3)}} \right\}$$

$B_{ij}^{k+1}$ denoting a calculated state transition parameter vector of the data analysis matrix at the k+1th iteration, $A^{GK}$ denoting a global accuracy parameter vector of all current data analysis matrices, and $E^{GK}$ denoting efficiency parameter vectors of all the current data analysis matrices, a state transition parameter vector of each data analysis matrix is calculated at the k+1th iteration, finally a data analysis matrix currently with the maximum determination parameter is output, and motor loss may be obtained based on use of a motor efficiency formula for an output data analysis matrix, so as to rapidly detect the motor parameter.

By obtaining motor parameter source data, analyzing the source data, obtaining the accuracy parameter vector and the efficiency parameter vector, determining an optimal parameter corresponding to the optimal data analysis matrix, and finally outputting a data analysis matrix of the optimal parameter, the motor loss is determined through an efficiency parameter. High efficiency indicates small motor loss, and low efficiency indicates big loss. Then loss may be inferred from an efficiency and loss relational expression, to finally get a detection result, and realize high-accuracy high-efficiency and desirable data analysis.

The invention claimed is:
1. A device for rapidly detecting energy efficiency of a permanent magnet synchronous motor, comprising a test platform (1), an energy circulation device (6), and a data synchronous acquisition module (18), four corners of a lower end surface of the test platform (1) being fixedly connected to support legs (2), the support leg (2) being in threaded connection to the test platform (1) through a support rod, an upper end surface of the test platform (1) being provided with baffles to define a motor mounting tank (8), a bolt hole (7) being provided in a surface of an outer baffle of the motor mounting tank (8) in a penetrating mode, the energy circulation device (6) being mounted on a surface of a fixed baffle on one end of the motor mounting tank (8), a second intelligent power analyzer (5), a first intelligent power analyzer (4), and a temperature inspection instrument (3) being sequentially mounted on an upper surface of a tail end on a right side of the test platform (1), the second intelligent power analyzer (5), the first intelligent power analyzer (4), and the temperature inspection instrument (3) being electrically connected to the energy circulation device (6) through wires, the data synchronous acquisition module (18) being provided on one end of an inner wall of the motor mounting tank (8) in an abutting mode, and the data synchronous acquisition module (18) comprising a control module (19), a data acquisition module (20), and a data analysis module (21);

the data acquisition module (20) configured to execute a process comprising:
step 1: creating, according to operation parameters set through a microprocessor in the control module (19), wireless connection between the data acquisition module (20) and an external master station server;
step 2, synchronously acquiring, by the microprocessor in the control module (19) through a data acquisition interface circuit according to a set task, motor parameters at the same time point, and then transmitting acquired data to a memory; and
step 3, reading, by the master station server through a wireless communication module, data parameters in the memory regularly or randomly; and a data analysis process of the data analysis module (21) comprising:
step 1, obtaining the data transmitted by the data acquisition module (20) to the memory to be stored, then taking, according to different states, motor parameters comprising a rotation speed, a position, torque, a voltage, a current, a temperature, and vibration as a data analysis matrix, the data analysis matrix comprising a current accuracy parameter vector and a current efficiency parameter vector, the accuracy parameter vector being obtained from motor operation data, and the motor operation data comprising a voltage, a current, a rotation angle, and a rotation speed, determining, through an iteration coefficient of the data parameter, an initial vector, and a convergence method, whether the parameter is an accuracy parameter, so as to screen the accuracy parameter from all parameters, the efficiency parameter vector being obtained from motor operation data, the motor operation data comprising a voltage, a current, a rotation angle, and a rotation speed, and determining, through an iteration coefficient of the data parameter, an initial vector, and a convergence method, whether the parameter, an efficiency value, is within a normal value range of the motor parameter, so as to screen an efficiency parameter from all parameters;
step 2, determining, according to a current accuracy parameter vector and a current efficiency parameter vector of each data analysis matrix, an optimal data analysis matrix; and
step 3, outputting the optimal data analysis matrix.

2. The device for rapidly detecting energy efficiency of a permanent magnet synchronous motor according to claim 1, wherein the motor mounting tank (8) is in threaded connection to a guide rod (11) through a through hole penetrating the surface of the baffle, an outer surface of the guide rod (11) being fixedly connected to a spring (10), and a front surface of the guide rod (11) being fixedly provided with a limiting flange (9).

3. The device for rapidly detecting energy efficiency of a permanent magnet synchronous motor according to claim 1, wherein the energy circulation device (6) comprises an incoming line control apparatus, variable-frequency power supplies (14), a test system apparatus, and a peripheral auxiliary apparatus, the incoming line control apparatus comprising an incoming line unit (16) and a rectification unit (15), the incoming line unit (16) being positioned on an upper side of the rectification unit (15) and connected to a controller, the variable-frequency power supplies (14) being variable-frequency board mounted power 1 (BMP1) and board mounted power 2 (BMP2), four variable-frequency power supplies (14) being provided, the four variable-frequency power supplies (14) all being positioned on a lower side of the rectification unit (15), the test system apparatus comprising an intelligent measurement unit (13), a motor to be tested, and an accompanying motor to be tested, one end of the intelligent measurement unit (13) being electrically connected to one end of a motor (12) through a wire, and the other end of the motor (12) being connected to the variable-frequency power supply (14).

4. The device for rapidly detecting energy efficiency of a permanent magnet synchronous motor according to claim 1, wherein in step 2 of the data acquisition process of the data acquisition module (20), motor parameters are acquired in four states: a cold state, a thermally stable state, a load state, and a no-load state, and then motor parameters in different states are obtained.

5. The device for rapidly detecting energy efficiency of a permanent magnet synchronous motor according to claim 4, wherein in step 2 of the data analysis process of the data analysis module (21), an initial iteration parameter k is set as 0, the number of current iteration k is added by 1, the current accuracy parameter vector and the current efficiency parameter vector are substituted into a determination parameter formula:

$$Z^k = \omega * \sum_{i=1}^{m} \sum_{j=1}^{n} A_{ij}^K + \varsigma * \sum_{i=1}^{m} \sum_{j=1}^{n} E_{ij}^K,$$

and
a current determination parameter of each data analysis matrix is calculated, $A_{ij}^K$ and $E_{ij}^K$ denoting the current accuracy parameter vector and the current efficiency parameter vector respectively, $Z^k$ denoting the current determination parameter of the data analysis matrix, k denoting the number of current iteration, $k \in [1,d]$, d being a preset threshold value, m and n denoting adjustment constants, $\omega$ and $\varsigma$ denoting adjustment factors of the accuracy parameter vector and the efficiency parameter vector respectively, i denoting the number of rows of the data analysis matrix, i=0, 1, . . . , m, j denoting the number of columns of the data analysis matrix, and j=0, 1, . . . , n.

6. The device for rapidly detecting energy efficiency of a permanent magnet synchronous motor according to claim 5, wherein an evaluation value and an evaluation reference value of a data analysis matrix currently with the maximum determination parameter are generated according to an accuracy parameter vector and an efficiency parameter vector of the data analysis matrix currently with the maximum determination parameter, and then according to an evaluation value function:

$$\theta^k = \omega * \int_0^\omega \frac{1}{\sqrt{\left|\sum_{i=1}^{m} \sum_{j=1}^{n} A_{ij}^K\right|^3}} dx + \varsigma * \int_0^\omega \frac{1}{\sqrt{\left|\sum_{i=1}^{m} \sum_{j=1}^{n} E_{ij}^K\right|^3}} dx$$

the accuracy parameter vector and the efficiency parameter vector of the data analysis matrix currently with the maximum determination parameter are substituted into an iteration evaluation value function, to obtain an evaluation value of the data analysis matrix currently with the maximum determination parameter, $\theta^k$ denoting the evaluation value of the data analysis matrix currently with the maximum determination parameter, dx denoting a differential variable corresponding a definition domain [0, $\omega$], m and n denoting the adjustment constants, and $\omega$ and $\varsigma$ denoting adjustment factors of the accuracy parameter vector and the efficiency parameter vector respectively; and then according to an iteration evaluation reference value function:

$$(R^k)^2 = (m*n) * \sum_{i=1}^{m} \sum_{j=1}^{n} \left(M_{ij}^K - \overline{M^{GK}}\right)^2$$

a complex vector and an average value of the data analysis matrix currently with the maximum determination parameter generated through the accuracy parameter vector and the efficiency parameter vector are substituted into the iteration evaluation reference value function, to finally obtain an evaluation reference value of the data analysis matrix with the maximum determination parameter, $M_{ij}^K$ denoting the complex vector of the data analysis matrix currently with the maximum determination parameter, $$\overline{M^{GK}}$$

denoting the average value of the complex vector of the data analysis matrix currently with the maximum determination parameter, and $(R^k)^2$ denoting the evaluation reference value of the data analysis matrix currently with the maximum determination parameter.

\* \* \* \* \*

UNITED STATES PATENT AND TRADEMARK OFFICE
CERTIFICATE OF CORRECTION

| | |
|---|---|
| PATENT NO. | : 11,428,739 B1 |
| APPLICATION NO. | : 17/550187 |
| DATED | : August 30, 2022 |
| INVENTOR(S) | : Ying Hong |

Page 1 of 1

It is certified that error appears in the above-identified patent and that said Letters Patent is hereby corrected as shown below:

On the Title Page

In item (73) Assignee: Immediately following "JINLING HAIGUAN TECHNICAL CENTER, Nanjing (CN)" please insert -- and JIANGSU YANGTZE TESTING AND CERTIFICATION CO., LTD., Nanjing (CN) --.

Signed and Sealed this
Eighteenth Day of February, 2025

Coke Morgan Stewart
*Acting Director of the United States Patent and Trademark Office*